United States Patent
Gupta et al.

(10) Patent No.: US 11,468,943 B2
(45) Date of Patent: Oct. 11, 2022

(54) MEMORY POWER-GATING TECHNIQUES

(71) Applicant: Arm Limited, Cambridge (GB)

(72) Inventors: Lalit Gupta, Cupertino, CA (US); Cyrille Nicolas Dray, Antibes (FR); El Mehdi Boujamaa, Valbonne (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/942,708

(22) Filed: Jul. 29, 2020

(65) Prior Publication Data
US 2022/0036938 A1 Feb. 3, 2022

(51) Int. Cl.
*G11C 11/408* (2006.01)
*G11C 11/4093* (2006.01)
*G11C 11/16* (2006.01)
*G11C 7/10* (2006.01)

(52) U.S. Cl.
CPC .......... *G11C 11/4082* (2013.01); *G11C 7/106* (2013.01); *G11C 7/1087* (2013.01); *G11C 11/1673* (2013.01); *G11C 11/1675* (2013.01); *G11C 11/1697* (2013.01); *G11C 11/4093* (2013.01)

(58) Field of Classification Search
CPC ........... G11C 5/14; G11C 5/148; G11C 11/22; G11C 11/2297; G11C 11/4082; G11C 11/16; G11C 11/1697
USPC ............... 365/230.08, 226, 229, 228
See application file for complete search history.

(56) References Cited

U.S. PATENT DOCUMENTS

| | | | |
|---|---|---|---|
| 6,956,771 B2* | 10/2005 | Sarig | G11C 16/30 365/185.18 |
| 2005/0141319 A1* | 6/2005 | Jang | G11C 5/145 365/226 |
| 2015/0280703 A1* | 10/2015 | Jeon | H03K 17/6871 327/382 |

* cited by examiner

*Primary Examiner* — Alfredo Bermudez Lozada
(74) *Attorney, Agent, or Firm* — Pramudji Law Group PLLC; Ari Pramudji

(57) ABSTRACT

Various implementations described herein are related to a device having memory circuitry activated by a power-gated supply. The device may include level shifting circuitry that receives a switch control signal in a first voltage domain, shifts the switch control signal in the first voltage domain to a second voltage domain, and provides the switch control signal in the second voltage domain. The device may include power-gating circuitry activated by the switch control signal in the second voltage domain, and the power-gating circuitry may provide the power-gated supply to the memory circuitry to trigger activation of the memory circuitry with the power-gated supply when activated by the switch control signal in the second voltage domain.

13 Claims, 3 Drawing Sheets

Power-Gate (PG) Architecture 104

MEMORY POWER-GATING TECHNIQUES

BACKGROUND

This section is intended to provide information relevant to understanding the technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory designs, various challenges arise with non-volatile (NV) applications in reference to data retention. For instance, if a core voltage is already powered-up, and then if the periphery voltage powers-up after that, then the signal to inhibit write operations typically takes time to rise-up due to its dependency on the periphery voltage. As such, retention of data in this scenario cannot be saved with conventional NV memory designs, because it is typically indistinguishable from a default operational instance. In this instance, if the core voltage is powered-up, and if the clock is floating, then the wordline may be triggered to cause a false write that corrupts data in the NV memory, which will lose its retention property and likely cause damage. Thus, there exists a need to improve the physical layout of NV memory designs.

BRIEF DESCRIPTION OF THE DRAWINGS

Implementations of various techniques are described herein with reference to accompanying drawings. It should be understood, however, that the accompanying drawings illustrate only various implementations described herein and are not meant to limit embodiments of various techniques described herein.

DETAILED DESCRIPTION

Various implementations described herein refer to physical layout designs for implementing power-gating schemes and techniques for efficient applications. For instance, the various power-gating schemes and techniques described herein provide for power-gating architecture and self-deterministic level shifter that are configured to avoid glitch on a wordline while coming out of power down mode and retain retention properties of non-volatile memory (NVM). In some implementations, the power-gating schemes and techniques described herein may provide for a device having memory circuitry (e.g., NVM) that is activated by a power-gated supply. The device may include level shifting circuitry that receives a switch control signal in a first voltage domain, shifts the switch control signal in the first voltage domain to a second voltage domain (that is different than the first voltage domain), and provides the switch control signal in the second voltage domain. Also, the device may include power-gating circuitry that is activated by the switch control signal in the second voltage domain, and the power-gating circuitry may provide the power-gated supply to the memory circuitry to trigger activation of the memory circuitry with the power-gated supply when activated by the switch control signal in the second voltage domain.

Various implementations of power-gating schemes and techniques will now be described in greater detail herein below with reference to FIGS. 1-3.

Figure 1:
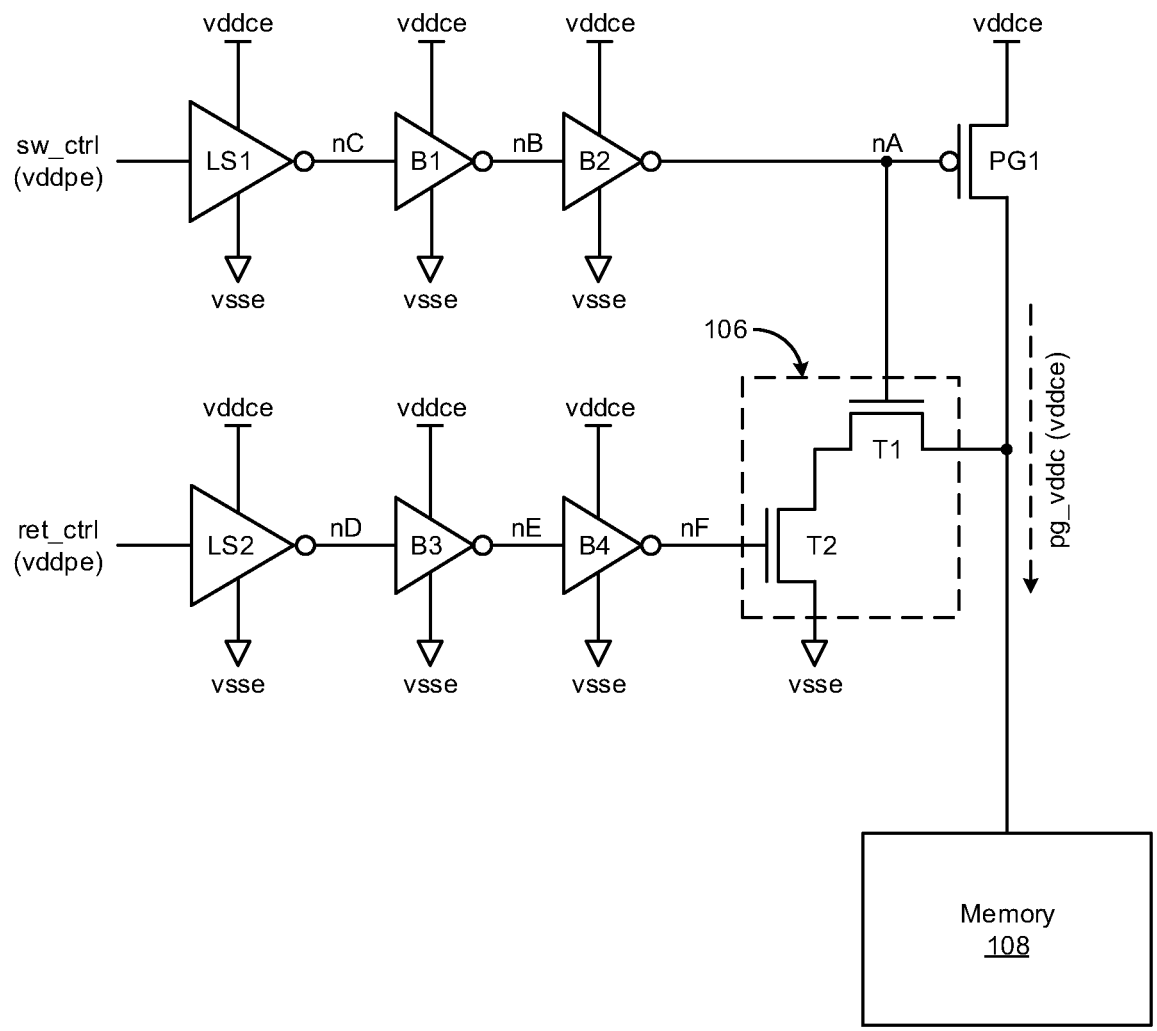
FIG. 1 illustrates a diagram of power-gate architecture in accordance with various implementations described herein.

FIG. 1 illustrates a schematic diagram 100 of power-gate architecture 104 in accordance with various implementations described herein.

In various implementations, the power-gate (PG) architecture 104 may refer to a system or a device having various integrated circuit (IC) components that are arranged and coupled together as an assemblage or combination of parts that provide for a physical circuit design and related structures. In some instances, a method of designing, fabricating and providing the power-gate architecture 104 as an integrated system or device may be implemented with various IC circuit components described herein so as to implement various power-gating schemes and techniques associated therewith. The power-gate architecture 104 may be integrated with various computing circuitry and components on a single chip, and also, the power-gate architecture 104 may be implemented in various embedded systems for various automotive, electronic, mobile and Internet-of-things (IoT) applications, including remote sensor nodes.

As shown in FIG. 1, the power-gate (PG) architecture 104 may include memory circuitry 108 that is activated by a power-gated supply (pg_vddc). In some instances, the memory circuitry 108 may refer to non-volatile memory (NVM) circuitry, and in some instances, the NVM circuitry may be implemented with magneto-resistive random access memory (MRAM) or static random access memory (SRAM).

The memory circuitry 108 may be implemented with one or more core arrays in various layout configurations with each core array having an array of memory cells or bitcells. Each bitcell may be configured to store at least one data bit value (e.g., a data value related to a logical '0' or '1'). The one or more core arrays may have any number of bitcells arranged in various configurations, such as, e.g., two-dimensional (2D) memory arrays having any number of columns and any number of rows of multiple bitcells, which may be arranged in a 2D grid pattern for read and write memory access operations. Also, each bitcell may be implemented with any type of memory, including, e.g., MRAM, SRAM, and/or any other type of similar memory. For instance, each bitcell may refer to a multi-layer MRAM bitcell having free-layers and pinned layers. In other instances, each bitcell may refer to a multi-transistor SRAM cell, such as, e.g., any type of complementary MOS (CMOS) SRAM cells, such as, e.g., 4T, 6T, 8T, 10T, or more transistors per bit.

The power-gate (PG) architecture 104 may include level shifting circuitry having a first level shifter (LS1) that is configured to receive a switch control signal (sw_ctrl) in a first voltage domain (vddpe), shift the switch control signal (sw_ctrl) in the first voltage domain (vddpe) to a second voltage domain (vddce), and also provide the switch control signal (sw_ctrl) in the second voltage domain (vddce). In some instances, the first voltage domain (vddpe) may refer to a periphery voltage domain, and the second voltage domain (vddce) may refer to a core voltage domain. The first level shifter (LS1) may be coupled in series with multiple buffers (B1, B2) and power-gating circuitry (PG1). The first level shifter (LS1) may be coupled between the source voltage supply (vddce) in the second voltage domain (vddce) and ground (vsse). Also, buffers (B1, B2) may be coupled between the source voltage supply (vddce) in the second voltage domain (vddce) and ground (vsse).

The level shifting (LS) circuitry may include a second level shifter (LS2) that receives a retention control signal (ret_ctrl) in the first voltage domain (vddpe), shifts the retention control signal (ret_ctrl) in the first voltage domain (vddpe) to the second voltage domain (vddce), and also provides the retention control signal (ret_ctrl) in the second voltage domain (vddce). Also, the second level shifter (LS2) may be coupled in series with multiple buffers (B3, B4) and logic circuitry (106), and the second level shifter (LS2) may be coupled between the source voltage supply (vddce) in the second voltage domain (vddce) and ground (vsse). Also, in some instances, buffers (B3, B4) may be coupled between the source voltage supply (vddce) in the second voltage domain (vddce) and ground (vsse).

In some implementations, use of the switch control signal (sw_ctrl) and the retention control signal (ret_ctrl) may be implemented as follows in Table 1:

TABLE 1

| sw_ctrl | ret_ctrl | Operational Mode |
| --- | --- | --- |
| 0 | 0 | Shutdown Mode (i.e., pg_vddc is collapsed) |
| 1 | X | Functional Mode |
| 0 | 1 | Sleep Mode (i.e., both vddpe and vddce are powered-up) |

The level shifting circuitry may include the logic circuitry 106 that couples the power-gated supply (pg_vddc) to ground (vsse) when activated. The logic circuitry 106 may include a first transistor (T1) that is activated based on the switch control signal (sw_ctrl) in the second voltage domain (vddce) at node (nA). The logic circuitry 106 may include a second transistor (T2) that is activated based on the retention control signal (ret_ctrl) in the second voltage domain (vddce) at node (nF). Transistors (T1, T2) may refer n-type metal-oxide-semiconductor (NMOS) transistors.

In some instances, the power-gate (PG) architecture 104 may include the power-gating circuitry (PG1) that is activated (or controlled) by the switch control signal (sw_ctrl) in the second voltage domain (vddce). The power-gating circuitry (PG1) may be configured to provide the power-gated supply (pg_vddc) to the memory circuitry 108 so as to trigger activation of the memory circuitry 108 with the power-gated supply (pg_vddc) when activated by the switch control signal (sw_ctrl) in the second voltage domain (vddce). The power-gating circuitry (PG1) may be implemented with a p-type metal-oxide-semiconductor (PMOS) transistor.

When activated, the power-gating circuitry (PG1) may provide the power-gated supply (pg_vddce) in the second voltage domain (vdcce) to the memory circuitry 108. The power-gating circuitry (PG1) may receive a source voltage supply (vddce) in the second voltage domain (vddce) and may also provide the power-gated supply (pg_vddce) in the second voltage domain (vddce) to the memory circuitry 108 based on the source voltage supply (vddce) in the second voltage domain (vddce). The power-gating circuitry (PG1) may include a PMOS transistor that operates as a power-gated switch (or simply, a power-gate) based on receiving the switch control signal (sw_ctrl) in the second voltage domain (vddce).

In some instances, the first level shifter (LS1) may receive the switch control signal (sw_ctrl) and then provide an output signal to the first buffer (B1) at node (nC), and the first buffer (B1) may receive the output signal from the first level shifter (LS1) at node (nC) and then provide an output signal to the second buffer (B2) at node (nB). The second buffer (B2) may receive the output signal from the first buffer (B1) at node (nB) and then provide an output signal to a gate of the power-gate (PG1) at node (nA). The second buffer (B2) may provide the output signal to a gate of the first transistor (T1) of the logic circuitry 106 at node (nA). The buffers (B1, B2) may be implemented with inverters.

In some instances, the second level shifter (LS2) may receive the retention control signal (ret_ctrl) and then provide an output signal to the third buffer (B3) at node (nD), and the third buffer (B3) may receive the output signal from the second level shifter (LS2) at node (nD) and then provide an output signal to the fourth buffer (B4) at node (nE). Also, the fourth buffer (B4) may receive the output signal from the third buffer (B3) at node (nE) and then provide an output signal to a gate of the second transistor (T2) of the logic circuitry 106 at node (nF). The buffers (B3, B4) may be implemented with inverters.

Figure 2:
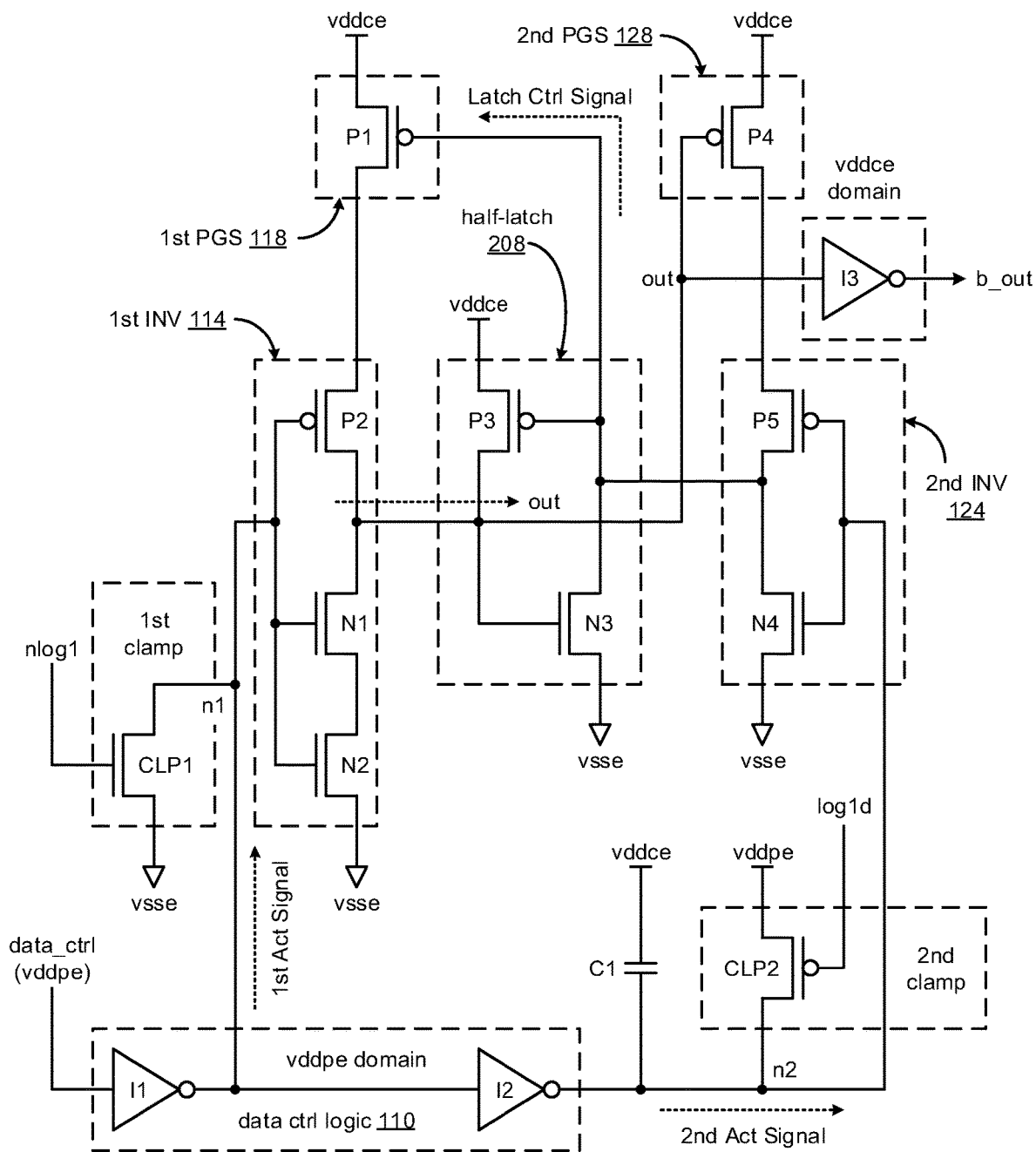
FIG. 2 illustrates a diagram level shifting circuitry in accordance with various implementations described herein.

FIG. 2 illustrates a diagram 200 of level shifting circuitry 204 in accordance with various implementations described herein.

In various implementations, the level shifting circuitry 204 may refer to a system or a device having various integrated circuit (IC) components that are arranged and coupled together as an assemblage or some combination of parts that provide for a physical circuit layout design and related structures. In some instances, a method of designing, fabricating and providing the level shifting circuitry 204 as an integrated system or device may include the various IC circuit components described herein so as to thereby implement the various power-gating schemes and techniques associated therewith. The level shifting circuitry 204 may be integrated with various computing circuitry and related components on a single chip, and the level shifting circuitry 204 may be implemented in various embedded systems for automotive, electronic, mobile and Internet-of-things (IoT) applications, including remote sensor nodes.

As shown in FIG. 2, the level shifting (LS) circuitry 204 may include a level shifter having data control circuitry 110 that provides activation signals (1st act signal, 2nd act signal) in the first voltage domain (vddpe). In some instances, the activation signals (1st act signal, 2nd act signal) may include a first activation signal (1st act signal) and a second activation signal (2nd act signal) that is a complement of the first activation signal (1st act signal). The data control circuitry 110 may include one or more inverters including a first inverter (I1) and a second inverter (I2). The first inverter (I1) may receive a data control signal (data_ctrl) in the first voltage domain (vddpe) and then provide the first activation signal (1st act signal) in the first voltage domain (vddpe). Also, the second inverter (I2) may receive the first activation signal (1st act signal) in the first voltage domain (vddpe) and then provide a second activation signal (2nd act signal) in the first voltage domain (vddpe). In some instances, as described herein, the first voltage domain (vddpe) may refer to a periphery voltage domain, and also, the second voltage domain (vddce) may refer to a core voltage domain.

The level shifting (LS) circuitry 204 may include various logic circuitry (e.g., combination of 114, 118 and 124, 128) that provides an output signal (out) in a second voltage domain (vddce) based on the activation signals (1st act signal, 2nd act signal) in the first domain (vddpe). In some instances, the logic circuitry (114, 118 and 124, 128) may include first logic circuitry (114, 118) and second logic circuitry (124, 128). The first logic circuitry (114, 118) may include a first power-gated switch (P1) and first inversion logic (114: P2, N1, N2) that are coupled between a source voltage supply (vddce) in the second domain (vddce) and ground (vsse). Also, the second logic circuitry (124, 128) may include a second power-gated switch (P4) and second inversion logic (124: P5, N4) that are coupled between the source voltage supply (vddce) in the second domain (vddce) and ground (vsse).

In some instances, the logic circuitry includes the first power-gated switch (1st PGS: 118: P1) and the first inversion logic (1st INV 114) that are coupled in series between the source voltage supply (vddce) and ground (vsse). The first power-gated switch (P1) may include PMOS transistor (P1), and the first inversion logic (1st INV 114) may include PMOS transistor (P2) along with NMOS transistors (N1, N2). Also, the logic circuitry includes the second power-gated switch (2nd PGS: 128: P4) and the second inversion logic (2nd INV 124) that are coupled in series between the source voltage supply (vddce) and ground (vsse). The second power-gated switch (P4) may include PMOS transistor (P4), and the second inversion logic (2nd INV 124) may include PMOS transistor (P5) along with NMOS transistor (N4).

The level shifting (LS) circuitry 204 may include latch circuitry (half-latch 208) that provides a latched control signal (latch ctrl signal) to a power-gate (e.g., first power-gated switch P1) of the logic circuitry (114, 118 and 124, 128) based on the activation signals (1st act signal, 2nd act signal) so as to trigger activation of the logic circuitry (114, 118 and 124, 128) so as to thereby provide the output signal (out) in the second voltage domain (vddce). In some instances, the first power-gated switch (P1) may be activated by the latched control signal (latch ctrl signal), wherein the first inversion logic (114: P2, N1, N2) may be activated by the first activation signal (1st act signal), and wherein the second power-gated switch (P4) may be activated by the output signal (out), and wherein the second inversion logic (124: P5, N4) may be activated by the second activation signal (2nd act signal). Also, the second inversion logic (124: P5, N4) may provide the latch control signal (latch ctrl signal) as a buffered activation signal to the latch circuitry (half-latch 208), and the latch circuitry 208 may operate as a half-latch that receives the buffered activation signal and provides the latched control signal (latch ctrl signal) to a part of the logic circuitry (118) to activate the first power-gated switch (P1).

In some instances, the latch circuitry 208 may have one or more transistors, such as, e.g., PMOS transistor (P3) and NMOS transistor (N3) that are arranged and configured to operate as a half-latch. The transistor (P3) may be coupled between the source voltage supply (vddce) and a gate of transistor (N3), and also, transistor (N3) may be coupled between a gate of transistor (P3) and ground (vsse). In addition, the gate of transistor (P3) may be coupled to the gate of transistor (P1), and also, the gate of transistor (N3) may be coupled to the output of the first inversion logic 114 and the gate of transistor (P4). The first inversion logic 114 may provide the output signal (out) to a output buffer (I3), which may provide a buffered output (b_out). The buffer (I3) may be implemented with an inverter.

In some instances, the level shifting (LS) circuitry 204 may include a first clamping transistor (CLP1) that is coupled between a first node (n1) and ground (vsse), wherein the first node (n1) is disposed between the first inverter (I1) of the data control circuitry 110 and the first inversion logic (114: P2, N1, N2) of the logic circuitry. Also, in some instances, the level shifting (LS) circuitry 204 may include a second clamping transistor (CLP2) that is coupled between the source voltage supply (vddpe) in the first domain (vddpe) and a second node (n2), wherein the second node (n2) is disposed between the second inverter (I2) of the data control circuitry 110 and the second inversion logic (124: P5, N4) of the logic circuitry. Also, the level shifting (LS) circuitry 204 may include at least one capacitor (C1) that is coupled between the source voltage supply (vddce) in the first domain (vddce) and the second node (n2).

In some instances, the first clamping transistor (CLP1) may be activated based on a first control signal (nlog1) that may be derived from the first voltage domain (vddpe) and the second voltage domain (vddce). Also, the second clamping transistor (CLP2) may be activated based on a second control signal (log1d) that may be derived from the first voltage domain (vddpe) and the second voltage domain (vddce), wherein the first control signal (nlog1) is different than the second control signal (log1d).

Figure 3:
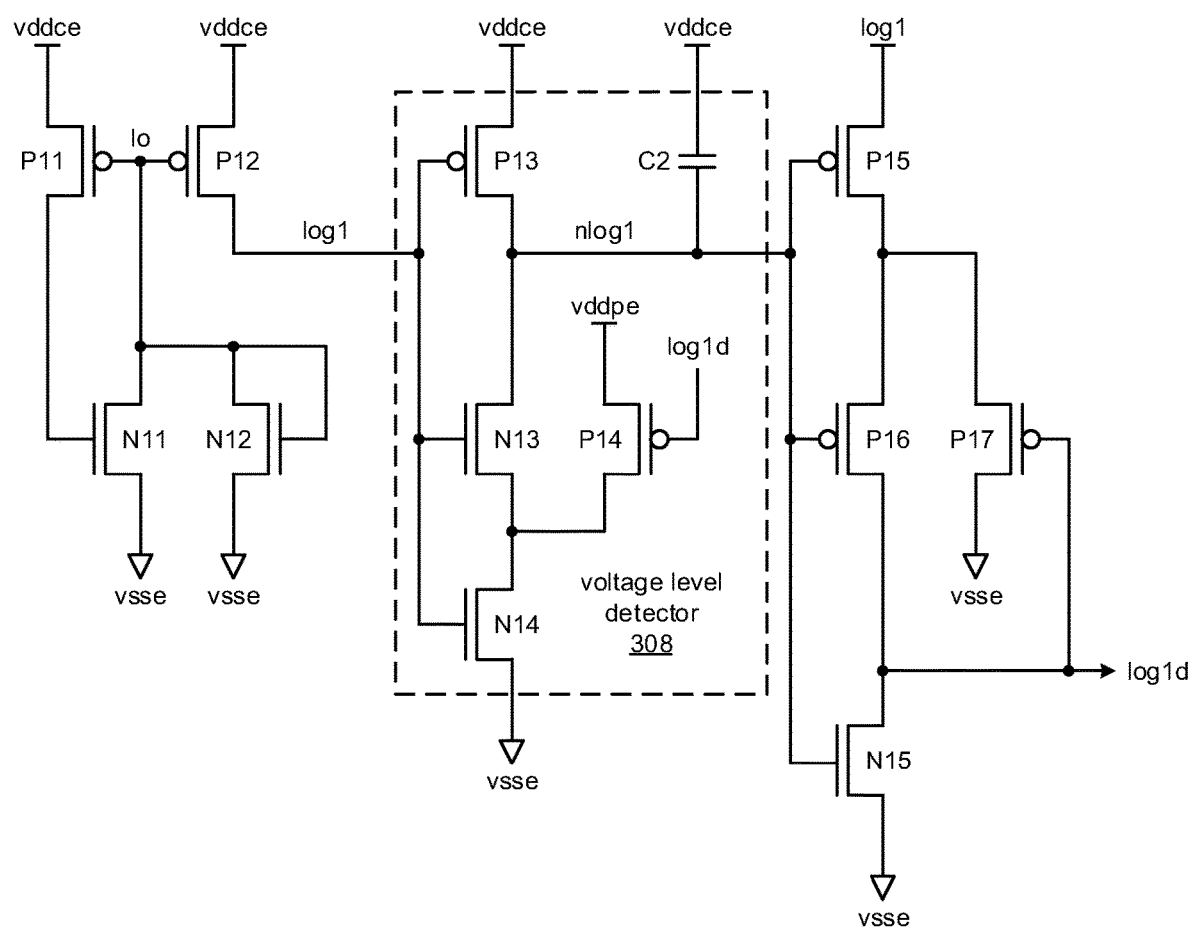
FIG. 3 illustrates a diagram of voltage tracking circuitry in accordance with various implementations described herein.

FIG. 3 illustrates a schematic diagram 300 of voltage tracking circuitry 304 in accordance with various implementations described herein.

In various implementations, the voltage tracking (VT) circuitry 304 may refer to a system or a device having integrated circuit (IC) components that are arranged and coupled together as an assemblage or some combination of parts that provide for a physical circuit layout design and related structures. In some instances, a method of designing, fabricating, building and providing the voltage tracking (VT) circuitry 304 as an integrated system or device may be implemented with the IC circuit components described herein so as to implement various power-gating schemes and techniques associated therewith. Also, the voltage tracking circuitry 304 may be integrated with computing circuitry and related components on a single chip, and the voltage tracking circuitry 304 may be implemented in embedded systems for automotive, electronic, mobile and Internet-of-things (IoT) applications, including remote sensor nodes.

As shown in FIG. 3, the voltage tracking (VT) circuitry 304 may include a voltage tracker having first inversion logic (e.g., combination of P13, N13, N14) that is coupled between the core voltage (vddce) and ground (vsse). The first inversion logic (P13, N13, N14) may be configured to provide the first control signal (nlog1) based on an input signal (log1). Also, the voltage tracking (VT) circuitry 304 may include at least one capacitor (C2) that is coupled between the source voltage supply (vddce) in the second domain (vddce) and the node (nlog1) that is coupled between transistors (P13, N13) and provides the first control signal (nlog1). In some instances, the first inversion logic (P13, N13, N14) may include PMOS transistor (P13), NMOS transistor (N13) and NMOS transistor (N14) that are coupled in series between the source voltage supply (vddce) and ground (vsse).

The voltage tracking (VT) circuitry 304 may include various input logic (e.g., combination of P11, P12, N11, N12) that is coupled between the core voltage (vddce) and ground (vsse). In some instances, the input logic (P11, P12, N11, N12) may have transistors (P11, N11) coupled together such that transistor (P11) is coupled between the core voltage (vddce) and a gate of transistor (N11) and such that transistor (N11) is coupled between gates of transistors (P11, P12, N12) and ground (vsse). Also, the gates of transistors (P11, P12) are coupled together at node (Io), and transistor (N12) is coupled as a diode between node (Io) and ground (vsse). When activated, transistor (P12) provides (or passes) the core voltage (vddce) as the input signal (log1).

The voltage tracking (VT) circuitry 304 may include second inversion logic (e.g., combination of P15, P16, N15) that is coupled between the input signal (log1) and ground (vsse). The second inversion logic (P15, P16, N15) may be configured to receive the first control signal (nlog1) and provide the second control signal (log1d) when activated by the first control signal (nlog1). Also, in some instances, the second inversion logic (P15, P16, N15) may include PMOS transistor (P15), PMOS transistor (P16) and NMOS transistor (N15) that are coupled in series between the first control signal (nlog1) and ground (vsse). The voltage tracking (VT) circuitry 304 may include PMOS transistor (P17) that is coupled between transistor (P15) and ground (vsse), and the gate of transistor (P17) may be coupled to node (log1d), which provides the second control signal (log1d) as output from the second inversion logic.

The voltage tracking (VT) circuitry 304 may include power-gate logic (P14) that is coupled between the periphery voltage (vddpe) and the first inversion logic (P13, N13, N14). The power-gate logic (P14) may be activated by the second control signal (log1d) to thereby provide the periphery voltage (vddpe) to the first inversion logic (P13, N13, N14). The first inversion logic (P13, N13, N14) and the power-gate logic (P14) may be coupled together to operate as a voltage level detector 308.

The various power-gating schemes and techniques described herein may provide some advantages. For instance, there may be no DC power during functional mode of operation, and also, in some instances, there may be no power sequence that needs to be followed. Also, in some instances, there may be no impact on level shifter delay during functional mode of operation. Further, in some instances, based on the periphery voltage (vddpe) level, a delay may be generated between the core voltage (vddce) and the control voltage (log1d), which may change the input state of the level shifter so as to thereby switch the level shifter in a deterministic direction.

It should be intended that the subject matter of the claims not be limited to the implementations and illustrations provided herein, but include modified forms of those implementations including portions of implementations and some combinations of elements of different implementations in accordance with the claims. It should be appreciated that in the development of any such implementation, as in any engineering or design project, numerous implementation-specific decisions should be made so as to achieve developers' specific goals, such as compliance with system-related and/or business related constraints that may vary from one implementation to another. Also, it should be appreciated that such a development effort may be complex and time consuming, but would nevertheless be a routine undertaking of design, fabrication, and manufacture for those of ordinary skill having benefit of this disclosure.

Described herein are various implementations of a device having memory circuitry that is activated by a power-gated supply. The device may include level shifting circuitry that receives a switch control signal in a first voltage domain, shifts the switch control signal in the first voltage domain to a second voltage domain, and provides the switch control signal in the second voltage domain. The device may include power-gating circuitry activated by the switch control signal in the second voltage domain, and the power-gating circuitry may provide the power-gated supply to the memory circuitry to trigger activation of the memory circuitry with the power-gated supply when activated by the switch control signal in the second voltage domain.

Described herein are various implementations of a level shifter. The level sifter may include data control circuitry that provides activation signals in the first voltage domain. The level sifter may include logic circuitry that provides an output signal in a second voltage domain based on the activation signals in the first domain. The level sifter may include latch circuitry that provides a latched control signal to a power-gate of the logic circuitry based on the activation signals so as to trigger activation of the logic circuitry to thereby provide the output signal in the second voltage domain.

Described herein are various implementations of a voltage tracker. The voltage tracker may include first inversion logic coupled between a core voltage and ground, and the first inversion logic may be configured to provide a first control signal based on an input signal. The voltage tracker may include second inversion logic coupled between the input signal and ground, and the second inversion logic may be configured to receive the first control signal and provide a second control signal when activated by the first control signal. The voltage tracker may include power-gate logic coupled between a periphery voltage and the first inversion logic. The power-gate logic may be activated by the second control signal to thereby provide the periphery voltage to the first inversion logic. The first inversion logic and the power-gate logic may be coupled together so as to operate as a voltage level detector.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. In addition, the terms "up" and "down"; "upper" and "lower";

"upwardly" and "downwardly"; "below" and "above"; and other similar terms indicating relative positions above or below a given point or element may be used in connection with some implementations of the various schemes, techniques, methods and/or technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
   memory circuitry activated by a power-gated supply;
   level shifting circuitry that receives a switch control signal in a periphery voltage domain, shifts the switch control signal in the periphery voltage domain to a core voltage domain, and provides the switch control signal in the core voltage domain;
   power-gating circuitry activated by the switch control signal in the core voltage domain, wherein the power-gating circuitry provides the power-gated supply to the memory circuitry to trigger activation of the memory circuitry with the power-gated supply when activated by the switch control signal in the core voltage domain; and
   logic circuitry that couples the power-gated supply to ground when activated by the switch control signal and a retention signal in the core voltage domain.

2. The device of claim 1, wherein the power-gating circuitry provides the power-gated supply in the core voltage domain.

3. The device of claim 1, wherein the power-gating circuitry receives a source voltage supply in the core voltage domain and provides the power-gated supply in the core voltage domain to the memory circuitry based on the source voltage supply in the core voltage domain.

4. The device of claim 1, wherein the power-gating circuitry comprises a p-type metal-oxide-semiconductor (PMOS) transistor that operates as a power-gate based on receiving the switch control signal in the core voltage domain.

5. The device of claim 1, wherein the level shifting circuitry comprises a level shifter and multiple buffers coupled in series to the power-gating circuitry.

6. The device of claim 1, wherein the memory circuitry refers to non-volatile memory (NVM) circuitry.

7. The device of claim 6, wherein the NVM circuitry comprises magneto-resistive random access memory (MRAM).

8. A device comprising:
   memory circuitry activated by a power-gated supply;
   level shifting circuitry that receives a switch control signal in a first voltage domain, shifts the switch control signal in the first voltage domain to a second voltage domain, and provides the switch control signal in the second voltage domain; and
   power-gating circuitry activated by the switch control signal in the second voltage domain, wherein the power-gating circuitry provides the power-gated supply to the memory circuitry to trigger activation of the memory circuitry with the power-gated supply when activated by the switch control signal in the second voltage domain,
   wherein the level shifting circuitry further receives a retention control signal in the first voltage domain, shifts the retention control signal in the first voltage domain to the second voltage domain, and provides the retention control signal in the second voltage domain.

9. The device of claim 8, wherein the level shifting circuitry includes logic circuitry that couples the power-gated supply to ground when activated, wherein the logic circuitry is activated based on the switch control signal in the second voltage domain and based on the retention control signal in the second voltage domain.

10. A device comprising:
    memory activated by a power-gated supply;
    power-gating circuitry activated by a switch control signal; and
    logic circuitry activated by the switch control signal and a retention control signal,
    wherein the power-gating circuitry provides the power-gated supply to the memory circuitry when activated by the switch control signal, and
    wherein the logic circuitry couples the power-gating circuitry and the power-gated supply to ground when activated by the switch control signal and the retention signal.

11. The device of claim 10, wherein:
    the power-gating circuitry is activated by the switch control signal in a core voltage domain, and
    the logic circuitry is activated by the switch control signal and the retention control signal in the core voltage domain.

12. The device of claim 10, further comprising:
    level shifting circuitry that receives the switch control signal in a periphery voltage domain, shifts the switch control signal in the periphery voltage domain to a core voltage domain, and provides the switch control signal in the core voltage domain,
    wherein the power-gating circuitry is activated by the switch control signal in the core voltage domain, and
    wherein the power-gating circuitry provides the power-gated supply to the memory circuitry to trigger activation of the memory circuitry with the power-gated supply when activated by the switch control signal in the core voltage domain.

13. The device of claim 12, wherein:
    the level shifting circuitry receives the retention control signal in the periphery voltage domain, shifts the retention control signal in the periphery voltage domain to the core voltage domain, and provides the retention control signal in the core voltage domain,
    the logic circuitry is activated by the switch control signal and the retention control signal in the core voltage domain, and
    the logic circuitry couples the power-gated supply to ground when activated by the switch control signal and the retention signal in the core voltage domain.

* * * * *